United States Patent
Steinhoff

(10) Patent No.: US 7,566,595 B2
(45) Date of Patent: Jul. 28, 2009

(54) METHOD OF MAKING AND USING GUARDRINGED SCR ESD PROTECTION CELL

(75) Inventor: Robert Michael Steinhoff, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/199,948

(22) Filed: Aug. 28, 2008

(65) Prior Publication Data
US 2008/0309394 A1    Dec. 18, 2008

Related U.S. Application Data

(62) Division of application No. 11/177,755, filed on Jul. 8, 2005, now Pat. No. 7,427,787.

(51) Int. Cl.
*H01L 21/332* (2006.01)
*H02H 9/00* (2006.01)

(52) U.S. Cl. .............. 438/133; 438/134; 438/140; 361/56

(58) Field of Classification Search ........ 438/134, 438/133, 140; 257/110, 173, 107, 355, 360, 257/361, 362, 363, E20.026
See application file for complete search history.

(56) References Cited

U.S. PATENT DOCUMENTS

| 5,880,488 | A | 3/1999 | Yu |
| 6,172,404 | B1 | 1/2001 | Chen et al. |
| 6,765,771 | B2* | 7/2004 | Ker et al. ............ 361/56 |
| 7,034,363 | B2* | 4/2006 | Chen ............ 257/355 |
| 7,179,691 | B1* | 2/2007 | Lee et al. ............ 438/135 |
| 2002/0079538 | A1 | 6/2002 | Su et al. |
| 2003/0007301 | A1 | 1/2003 | Ker et al. |
| 2003/0042498 | A1* | 3/2003 | Ker et al. ............ 257/173 |
| 2004/0004231 | A1 | 1/2004 | Peng et al. |
| 2004/0052019 | A1* | 3/2004 | Liu et al. ............ 361/56 |
| 2004/0065895 | A1* | 4/2004 | Lai et al. ............ 257/107 |
| 2005/0133869 | A1 | 6/2005 | Ker et al. |

* cited by examiner

*Primary Examiner*—Shouxiang Hu
(74) *Attorney, Agent, or Firm*—Wade J. Brady, III; Frederick J. Telecky, Jr.

(57) ABSTRACT

Methods and circuits are disclosed for protecting an electronic circuit from ESD damage using an SCR ESD cell. An SCR circuit is coupled to a terminal of an associated microelectronic circuit for which ESD protection is desired. The SCR used in the ESD cell of the invention is provided with a full guardring for shielding the SCR from triggering by fast transients. A resistor is provided at the guardring for use in triggering the SCR at the onset of an ESD event. Exemplary preferred embodiments of the invention are disclosed with silicide-block resistors within the range of about 2-1000 Ohms or less.

12 Claims, 2 Drawing Sheets

METHOD OF MAKING AND USING GUARDRINGED SCR ESD PROTECTION CELL

CROSS-REFERENCE TO RELATED APPLICATION

This application is a Divisional of and claims priority under 35 U.S.C. 120 to U.S. patent Ser. No. 11/177,755 filed on Jul. 8, 2005, and incorporated herein by reference,

TECHNICAL FIELD

The invention relates to the manufacture of semiconductor devices. More particularly, the invention relates to electrostatic discharge (ESD) protection for microelectronic circuits.

BACKGROUND OF THE INVENTION

Electrostatic discharge (ESD) events can cause damage to elements of circuitry due to current overload or reverse biasing. For example, the propagation of an ESD event through a circuit may cause a transistor to greatly exceed its current capacity, suffer physical damage, and subsequently fail. The potential for failure increases as circuitry becomes smaller and as voltage levels are reduced. ESD events may occur due to a relatively short period of high voltage or current imposed on a device. For example, ESD events are sometimes caused by contact with a human body, by machinery such as manufacturing or test equipment, or in electrically noisy environments, as may be incurred in many applications. A variety of ESD events can occur in electronic devices, including discharge between the pads of an integrated circuit, discharge between voltage supply terminals, and discharge between pads and voltage supply terminals. Various ESD protection circuitry is used in the arts to protect ICs from damage due to the occurrence of ESD events during manufacture, testing, and operation. In general, ESD protection circuitry is designed to protect the input/output pins or terminals and thereby shield the internal circuitry of an integrated circuit from excessively large and sudden discharges of electrostatic energy. Each pin in an integrated circuit must be coupled to an appropriate ESD protection circuit such that the ESD discharge current is shunted away from the internal portions of the chip that are the most sensitive to damage. As such, ESD discharge paths are often provided between every pair of pins in an IC for both positive and negative polarities.

ESD discharges are brief transient events that are usually less than one microsecond in duration and much higher in voltage than the normal operating voltage range. Furthermore, the rise times associated with these brief pulses are usually less than approximately twenty nanoseconds. The ESD protection circuit must begin conducting almost instantaneously so as to shunt the resulting ESD current. However, the ESD protection circuit must not respond to smaller voltage increases such as normal power-up events in usual chip operation. If the ESD protection circuit were to trigger erroneously and conduct during normal operation, the desired functioning of the IC could be compromised. Furthermore, in addition to triggering when needed for ESD protection, the ESD protection circuit must stay in a highly conductive state for the duration of the ESD pulse so that all of the ESD energy is safely discharged. If the ESD protection circuit were to shut down prematurely, damaging potentials could build up quickly and cause device failure. Yet another conflicting demand on an ESD protection circuit, however, is the need to shut down when ESD protection is no longer needed following an ESD event. Many ESD protection cells known in the art have a tendency to latch-up in an "on" state after an ESD event. One skilled in the arts is required to balance the tradeoffs among factors including ESD protection, resistance, and chip area constraints.

It is known to use silicon controlled rectifier (SCR) ESD protection cells in some applications, primarily due to economies in die area. One problem with SCRs that prevents their more widespread use, is that they have a tendency to latch up when exposed to fast transients, sometimes called "rate firing". As a result, an SCR ESD protection cell can be triggered by fast transients rather than an ESD event, or may remain in an "on" state beyond the duration of a triggering ESD event. Spurious triggering is obviously not helpful in providing ESD protection and latch-up is undesirable from a power consumption standpoint, as the latched ESD protection cell is permitted to draw supply current during periods when ESD protection is not required. Another problem encountered when using SCR circuits for ESD protection is directionality. Since common SCR circuits operate responsive to either a negative or positive voltage, it is known in the arts to use opposing SCR ESD protection circuits in pairs for bidirectional applications. A floating N-well is usually used in such instances to separate the individual SCRs, this makes the SCR pairs more susceptible to rate firing. Thus, although SCR circuits are sometimes used for protecting associated circuitry from damage due to ESD over-voltage stress, quiescent current consumption is higher, and die area is larger, than it might otherwise be.

Due to these and other problems, a need exists for circuits and methods that provide microelectronic circuits with SCR ESD protection having reduced area and low leakage, without adversely impacting the performance of the functional circuit path during normal operation.

SUMMARY OF THE INVENTION

In carrying out the principles of the present invention, in accordance with preferred embodiments thereof, the invention provides methods and circuits for the protection of microelectronic circuits from damage due to ESD events.

According to an aspect of the invention, a method of protecting an electronic circuit from ESD damage is disclosed for use in a fast-transient environment. Steps included in the preferred embodiments include operably coupling an SCR circuit to a terminal of the electronic circuit for which protection is desired. The SCR circuit is provided with a full guardring for shielding the SCR from fast transients. The SCR guardring is provided with a built-in resistance selected to provide triggering current for the SCR at the onset of an ESD event.

According to other aspects of the invention, the guardring resistance is selected from the range of 2-1000 Ohms.

According to another aspect of the invention, preferred embodiments use guardring resistors manufactured using silicide block processes.

According to yet another aspect of the invention, an ESD protection cell according to a preferred embodiment of the invention includes an SCR circuit for coupling in the path of an associated circuit for which ESD protection is desired. The SCR circuit further includes a guardring at the forward-biased SCR junction. A resistor incorporated into the SCR guardring is provided for use in triggering the SCR at the onset of an ESD event.

The invention has advantages including but not limited to providing microelectronic circuits, including those exposed to fast transients, with ESD protection cells having low holding voltage and small area. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1:
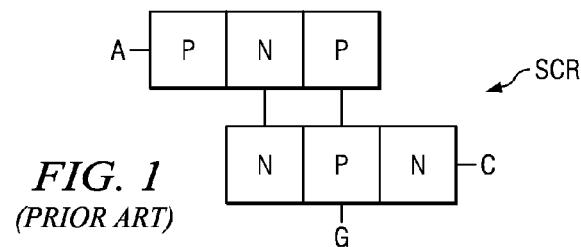
FIG. 1 (prior art) is a simplified schematic diagram showing an overview of a transistor-equivalent example of an SCR ESD cell.

Understanding of the invention may be enhanced by an appreciation of the silicon controlled rectifier (SCR) as known to those skilled in the arts. The SCR functions as an extremely fast switch capable of turning on or off in nanoseconds. The operation of the SCR may be understood in terms of two transistors as shown in the equivalent circuit of FIG. 1 (prior art). A four layer PNPN construction familiar in the arts has a gate G connection to an internal P region. A small negative current applied to the gate G biases the NPN transistor into cutoff, and the loop gain is less than unity. Under these conditions, the only current between output terminals A and C is the very small cutoff collector current of the two transistors. For this reason the impedance between A and C is very high. When positive current is applied to terminal G, the NPN transistor is biased into conduction, causing its collector current to rise. Since the current gain of the NPN transistor increases with increased collector current, a "breakover" point is reached. At this point, the collector current of the two transistors rapidly increases to a value limited only by the external circuit, both transistors are driven into saturation, and the impedance between A and C is very low. Gate current is required only until the anode current has built up to a point sufficient to sustain conduction (a few nanoseconds). After conduction from cathode C to anode A begins, removing the gate current has no effect. The SCR therefore remains on until it is turned off by a reduction in the collector (C to A) current to a value below that necessary to maintain conduction. Thus, the application of a positive current at the gate G can be used to trigger the SCR, changing it from what is for practical purposes an open circuit, to a short circuit. The short circuit path may be used to shunt potentially damaging ESD current away from protected circuitry.

The use of SCRs for ESD protection heretofore has been limited to applications where fast transients are not encountered. This is because, in addition to breakover, excessive rate of voltage change (dv/dt), can also trigger the SCR. This is brought about because the PNPN structure has inherent capacitances in the PN junctions. Capacitors characteristically oppose changes in voltage by drawing or supplying current. A fast rate of voltage change across the SCR junctions can cause the junction capacitance to draw enough current to activate the PNP/NPN transistor pair, triggering the SCR. The invention overcomes this problem, however, providing methods and circuits for adapting SCR ESD protection cells to usefulness in fast-transient applications.

Figure 2:
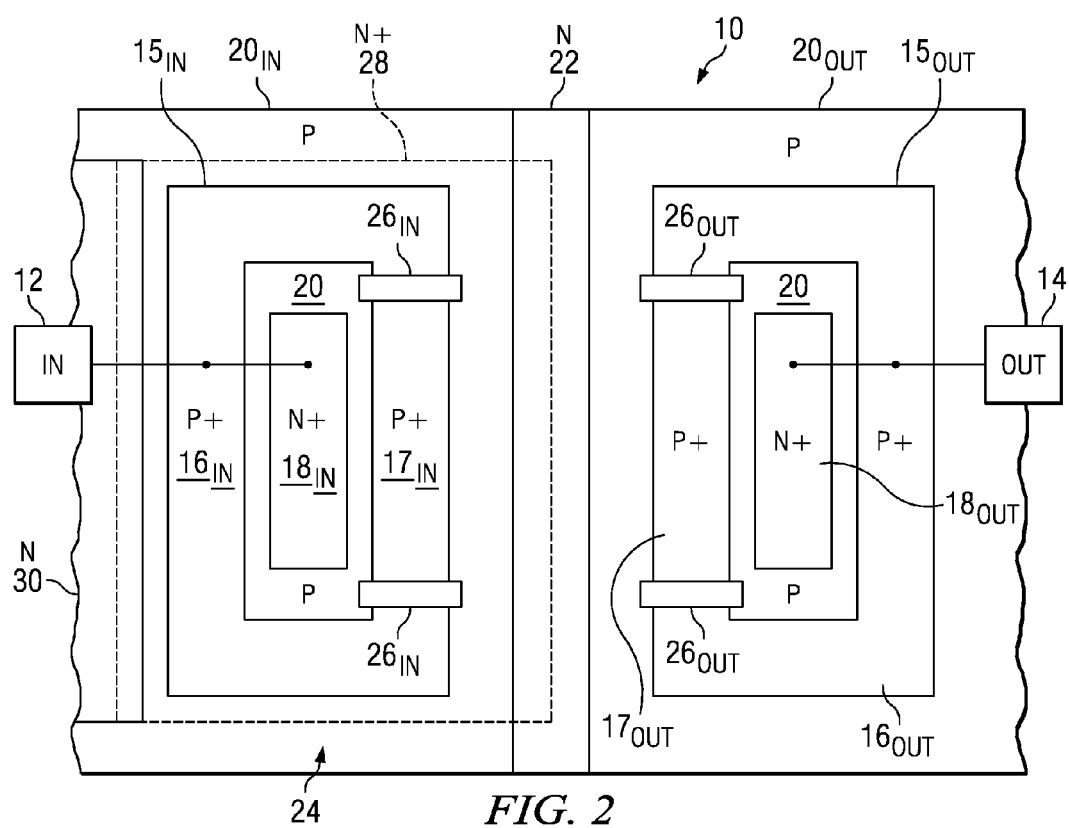
FIG. 2 is a simplified schematic diagram showing an example of a preferred embodiment of the SCR ESD cells and methods of the invention.

The invention provides an SCR ESD protection cell having attributes favorable for bidirectional and fast-transient applications. The SCR ESD protection cell is used to provide protection to associated IC circuitry. In a top view illustrating the methodology and circuitry of preferred embodiments, FIG. 2 depicts a guardringed SCR ESD protection cell 10 of the invention. The circuit 10 has input and output terminals 12, 14 for coupling to protect a terminal or pin of associated circuitry (not shown). Those skilled in the arts will appreciate that the protected associated circuitry may take many alternative forms without affecting the practice of the invention. Preferably, each terminal 12, 14, of the SCR ESD cell 10 has a similar P+ guardring $15_{IN}$, $15_{OUT}$. Referring to the structures adjacent to the input terminal 12, and the output terminal 14, the reference numerals used to refer to similar structures herein are differentiated as to function for the purposes of the current example by appending the subscripts IN and OUT respectively. Preferably, the guardring structures $15_{IN}$, $15_{OUT}$ at the opposing terminals 12, 14, have a similar structure, although they may function differently according to the polarity of incoming ESD events. Those skilled in the arts should appreciate that the embodiment shown and described is bidirectional, and that the operation of the invention in one direction is a mirror image of operation in the other. As such, for the purposes of example, the description herein is oriented in one direction, assuming the application of a sufficiently large positive triggering voltage from the input terminal 12 to the output terminal 14.

The guardring $15_{IN}$ is divided into a first P+ region $16_{IN}$ and a second P+ region $17_{IN}$. The division in the guardring $15_{IN}$ is maintained by a pair of resistors $26_{IN}$, in this example implemented as silicide-block resistors $26_{IN}$. Other resistor positions and structures may alternatively be used so long as the guardring $15_{IN}$ is separated into two functional regions, e.g., $16_{IN}$, $17_{IN}$, as sown and described. It should be understood that the required resistance may be incorporated into the guardrings in various physical manifestations and that the resistors shown in the drawings are an example for the purposes of describing the operation of a preferred embodiment of the invention and are not representative of a limitation to a particular construction or of discrete resistors. For example, the resistors may alternatively be implemented in the form of, polysilicon, metal, or diffusion regions. The guardring $15_{IN}$ encircles an N+ region $18_{IN}$. Both the P+ guardring $15_{IN}$ and N+ region $18_{IN}$ are encompassed by a P substrate $20_{IN}$. An N-well 22 is provided between the terminals 12, 14, and an isolation structure 24, preferably an N− well 30 combined with an N-buried layer (NBL) 28, is used to electrically isolate at least one of the terminals, in this example input terminal 12. Those reasonably skilled in the arts will recognize that the SCR ESD cell 10 embodying the invention may be implemented using various alternative shapes and orientations so long as the full guardrings $15_{IN}$, $15_{OUT}$ are provided. Functionally equivalent configurations are possible without departure from the invention. For example, variations such as providing isolation at either the input or output terminal only, or changes in the layout of the P and N regions are possible without altering the invention.

Figure 3:
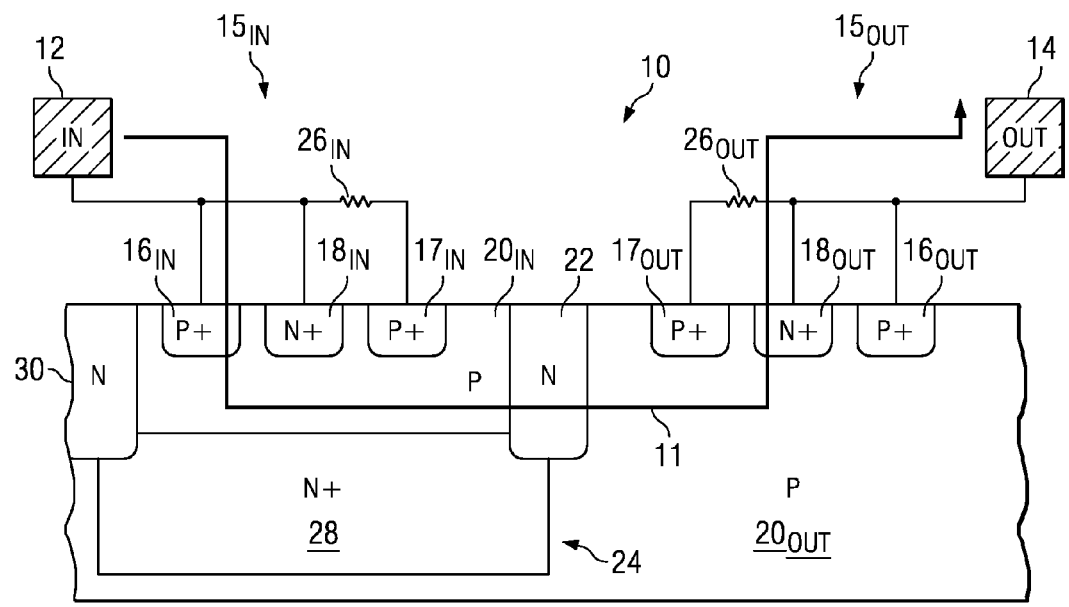
FIG. 3 is a sectional partial view of an example of a preferred embodiment of an SCR ESD protection cell structure of the invention.

In practice, the guardringed SCR ESD cell 10 is connected to associated circuitry to be protected from ESD events. Now referring primarily to FIG. 3, following the PNPN current path indicated by arrow 11 will indicate an example of the operation of the invention. The occurrence of an ESD event at terminal 12 places a load on the resistor $26_{OUT}$. The resistor $26_{OUT}$ draws sufficient current to de-bias the P region $20_{OUT}$, in order to trigger the SCR ESD cell 10, which then shunts the excessive ESD energy from the protected circuit at input terminal 12, through output terminal 14. It can be seen from FIG. 3 that the PNPN path 11 is from terminal 12, to P+ material at the terminal side of the guardring $16_{IN}$, then to the underlying P material $20_{IN}$, to the dividing N− barrier 22, then to the P material $20_{OUT}$, next to N+ $18_{OUT}$, and ultimately to the output terminal 14. Examination of the Figure will reward those skilled in the arts with the understanding that, in the case of a reversed-polarity ESD event, a mirror image PNPN path would be implemented from the output terminal 14 to the input terminal 12.

The full guardring structures $15_{IN}$, $15_{OUT}$ prevent the SCR ESD protection cell 10 from latching when exposed to fast transients. A full guardring effectively acts as a filter, preventing latch-up due to current buildup in the PN junctions during fast transient voltage swings. The exemplary embodiments of the invention as illustrated and described have been found to be useful in applications having fast transients, e.g., >10 V/ns, without erroneous triggering. Thus, the invention may be used to provide ESD protection in applications where fast transients are anticipated, for example, in relatively fast driver circuits. Additionally, the invention may be used in bidirectional applications in which the protected circuitry is subjected to voltage swings taking the input terminal to levels both above and below the voltage of the output terminal. For example, the preferred embodiment of the invention shown and described may be used to protect a high-speed driver terminal subjected to voltage swings from −30 Volts to +30 Volts.

As noted elsewhere herein, the guardrings $15_{IN}$, $15_{OUT}$ include the characteristic of providing a resistance $26_{IN}$, $26_{OUT}$ used for triggering the SCR ESD protection cell 10. One preferred technique of providing a suitable resistor $26_{IN}$, $26_{OUT}$ includes the use of blocked silicide processes known in the arts to furnish resistive regions at the SCR-facing sides $17_{IN}$, $17_{OUT}$ of the guardrings $15_{IN}$, $15_{OUT}$ as shown. In blocked silicide processes, the formation of low-resistance silicide layers is prevented in regions where resistors are required. Such resistors in the presently preferred embodiments described herein are referred to as silicide-block resistors. Although silicide blocking processes are preferred for implementation of the resistors of the invention using common manufacturing techniques, alternative means of providing resistance for use in triggering the SCR may also be used. It has been determined that resistance levels within the range of about 2 to 1000 Ohms are particularly suited for implementation of the preferred embodiment of the invention. This range of resistance is typical using currently common manufacturing dimensions, e.g., total area ~40 um×80 um. The dimensions, and therefore the resistance, may be changed without departing from the principles of the invention. For example, doubling the size of the ESD protection cell would reduce the resistance range by about one half. It should be appreciated by those skilled in the arts that the bidirectional aspect of the invention is achieved due to the effect of resistor $26_{IN}$, $26_{OUT}$ as shown and described. The amount of resistance is selected in order to provide current sufficient to trigger the SCR ESD cell 10 responsive to a voltage level predetermined based upon the anticipated operation of the associated circuit. Absent a load on the resistor 26, leakage current is low because the SCR ESD cell 10 does not conduct. Thus, the invention is efficient in terms of power consumption.

Figure 4:
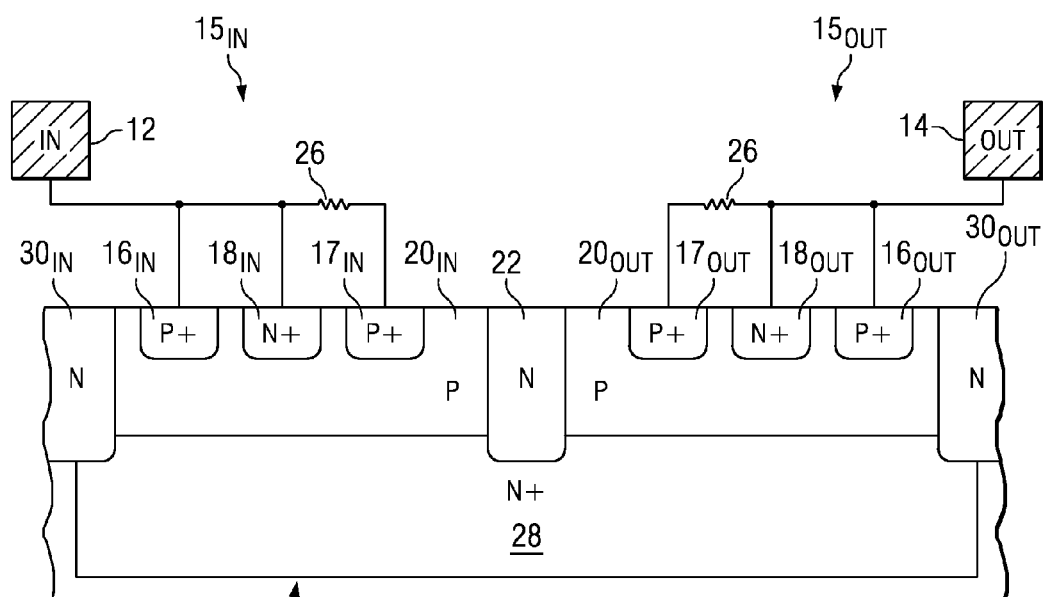
FIG. 4 is a sectional partial view of an example of an alternative preferred embodiment of an SCR ESD protection cell structure of the invention.

FIG. 4 shows a partial cross-section view of an alternative embodiment of the invention. A symmetrical configuration is shown which includes isolation of both terminals 12, 14 of the SCR ESD cell 10. An extensive buried N-well 28 underlies both the input and output terminals 12, 14, as shown. The terminals 12, 14 are isolated by the addition of an outer N-well 30 connecting with the buried N layer 28 adjacent to each terminal 12, 14. In this embodiment, the terminal connected to the protected circuitry is isolated regardless of polarity. In other respects, the example is similar in structure and operation to the example shown and described with respect to FIGS. 2 and 3; The current path, i.e. PNPN structure, responsive to an ESD event is the same.

The methods and circuits of invention provide advantages including but not limited to providing reliable bidirectional ESD protection with reduced area and power consumption. Additional advantages of the invention include the capability of providing rapid and efficient ESD protection in bidirectional operating environments and avoiding latch-up due to fast transients. While the invention has been described with reference to certain illustrative embodiments, those described herein are not intended to be construed in a limiting sense. Various modifications and combinations of the illustrative embodiments as well as other advantages and embodiments of the invention will be apparent to persons skilled in the arts upon reference to the drawings, description, and claims.

The invention claimed is:

1. A method of protecting an electronic circuit from ESD damage:
   operably coupling an SCR circuit having first and second terminals to a terminal of the electronic circuit,
   wherein the SCR circuit has a full guardring for shielding the SCR circuit from triggering by fast transients;
   wherein the guardring includes a pair of resistors resulting in a guardring resistance for triggering the SCR at the onset of an ESD event; and
   wherein the SCR circuit includes:
   a lightly doped region of a first conductivity type;
   a first highly doped region of a second conductivity type opposite the first conductivity type, wherein the first highly doped region is disposed within the lightly doped region at a surface of the lightly doped region, and at least a portion of the boundary between the first highly doped region and the lightly doped region forms a forward-biased SCR junction;
   a second highly doped region of the first conductivity type forming the guardring disposed within the lightly doped region at the surface, wherein the guardring surrounds the first highly doped region in a plane coplanar to the surface; and
   the pair of resistors dividing the guardring into first and second regions, wherein the resistors are disposed at the surface, wherein
   the first region of the guardring is electrically connected to the first terminal; and the second region of the guardring is electrically connected to the first terminal throucih the resistors.

2. The method of protecting an electronic circuit from ESD damage according to claim 1 further comprising the step of selecting the guardring resistance from the range of approximately 2-1000 Ohms.

3. The method of protecting an electronic circuit from ESD damage according to claim 1 further comprising the step of selecting the guardring resistance of less than 2 Ohms.

4. The method of protecting an electronic circuit from ESD damage according to claim 1 wherein the resistors at the guardring are formed by using a silicide block process.

5. The method of protecting an electronic circuit from ESD damage according to claim 1 further comprising the step of isolating the terminal coupling.

6. A method of forming an ESD protection cell comprising:
   forming an SCR circuit having first and second terminals for coupling in an electrical path of an associated circuit to provide ESD protection for the associated circuit, comprising:
   forming a lightly doped region of a first conductivity type;
   forming a first highly doped region of a second conductivity type opposite the first conductivity type, wherein the first highly doped region is disposed within the lightly doped region at a surface of the lightly doped region, and at least a portion of the boundary between the first highly doped region and the lightly doped region forms a forward-biased SCR junction;
   forming a second highly doped region of the first conductivity type forming a guardring disposed within the lightly doped region at the surface, wherein the guardring surrounds the first highly doped region in a plane coplanar to the surface; and
   forming a pair of resistors dividing the guardring into first and second regions, wherein the resistors are disposed at the surface and the resistors result in a guardring resistance used to trigger the SCR circuit at the onset of an ESD event, wherein
   the first region of the guardring is electrically connected to the first terminal; and
   the second region of the guardring is electrically connected to the first terminal through the resistors.

7. The method of forming an ESD protection cell according to claim 6 further comprising the step of selecting the guardring resistance from the range of approximately 2-1000 Ohms.

8. The method of forming an ESD protection cell according to claim 6 further comprising the step of selecting the guardring resistance less than 2 Ohms.

9. The method of forming an ESD protection cell according to claim 6 wherein the resistors at the guardring are formed by using a silicide block process.

10. The method of forming an ESD protection cell according to claim 6 further comprising:
    forming a third highly doped region of the first conductivity type disposed within the lightly doped region at the surface, wherein the third highly doped region is electrically connected to the second terminal; and
    forming an isolation structure between the first and second terminals.

11. The method of forming an ESD protection cell according to claim 10 wherein the isolation structure comprises an N-well and an adjacent buried N layer.

12. The method of forming an ESD protection cell according to claim 10 wherein the isolation structure comprises a buried N layer bordered by two adjacent N-wells.

* * * * *